United States Patent
Dariush et al.

(10) Patent No.: US 8,170,287 B2
(45) Date of Patent: May 1, 2012

(54) REAL-TIME SELF COLLISION AND OBSTACLE AVOIDANCE

(75) Inventors: Behzad Dariush, Sunnyvale, CA (US); Youding Zhu, Columbus, OH (US); Kikuo Fujimura, Palo Alto, CA (US)

(73) Assignee: Honda Motor Co., Ltd., Tokyo (JP)

( * ) Notice: Subject to any disclaimer, the term of this patent is extended or adjusted under 35 U.S.C. 154(b) by 820 days.

(21) Appl. No.: 12/257,664

(22) Filed: Oct. 24, 2008

(65) Prior Publication Data

US 2009/0074252 A1    Mar. 19, 2009

Related U.S. Application Data

(60) Provisional application No. 60/983,061, filed on Oct. 26, 2007, provisional application No. 61/088,985, filed on Aug. 14, 2008.

(51) Int. Cl.
*G06K 9/00* (2006.01)

(52) U.S. Cl. ......... 382/106; 382/107; 382/181; 382/259

(58) Field of Classification Search ................... 382/128, 382/132, 134, 209, 195, 180, 107, 159, 106, 382/115, 116, 117, 118, 103, 285, 154, 168, 382/181, 184, 190; 700/245, 264, 424; 345/473, 345/474

See application file for complete search history.

(56) References Cited

U.S. PATENT DOCUMENTS

| | | | |
|---|---|---|---|
| 4,831,549 A | 5/1989 | Red et al. | |
| 5,159,249 A | 10/1992 | Megherbi | |
| 5,293,461 A | 3/1994 | Grudic et al. | |
| 5,430,643 A | 7/1995 | Seraji | |
| 5,550,953 A | 8/1996 | Seraji | |
| 5,586,224 A | 12/1996 | Kunii et al. | |
| 5,625,577 A | 4/1997 | Kunii et al. | |
| 5,675,720 A * | 10/1997 | Sato et al. | 345/419 |
| 5,737,500 A | 4/1998 | Seraji et al. | |
| 5,808,433 A | 9/1998 | Tagami et al. | |
| 6,004,016 A | 12/1999 | Spector | |
| 6,236,737 B1 | 5/2001 | Gregson et al. | |
| 6,331,181 B1 | 12/2001 | Tierney et al. | |
| 6,341,246 B1 | 1/2002 | Gerstenberger et al. | |
| 6,424,885 B1 | 7/2002 | Niemeyer et al. | |
| 6,456,901 B1 | 9/2002 | Xi et al. | |
| 6,493,608 B1 | 12/2002 | Niemeyer | |
| 6,674,877 B1 | 1/2004 | Jojic et al. | |
| 6,699,177 B1 | 3/2004 | Wang et al. | |

(Continued)

OTHER PUBLICATIONS

PCT International Search Report and Written Opinion, PCT/US08/87657, Mar. 19, 2009, 8 pages.

(Continued)

*Primary Examiner* — Vikkram Bali
*Assistant Examiner* — Nancy Bitar
(74) *Attorney, Agent, or Firm* — Fenwick & West LLP

(57) ABSTRACT

A system, method, and computer program product for avoiding collision of a body segment with unconnected structures in an articulated system are described. A virtual surface is constructed surrounding an actual surface of the body segment. Distances between the body segment and unconnected structures are monitored. Responding to an unconnected structure penetrating the virtual surface, a redirected joint motion that prevents the unconnected structure from penetrating deeper into the virtual surface is determined. The body segment is redirected based on the redirected joint motion to avoid colliding with the unconnected structure.

36 Claims, 6 Drawing Sheets

U.S. PATENT DOCUMENTS

| | | | |
|---|---|---|---|
| 6,708,142 B1 * | 3/2004 | Baillot et al. | 703/2 |
| 6,786,896 B1 | 9/2004 | Madhani et al. | |
| 6,853,964 B1 * | 2/2005 | Rockwood et al. | 703/2 |
| 6,985,620 B2 | 1/2006 | Sawhney et al. | |
| 7,292,151 B2 | 11/2007 | Ferguson et al. | |
| 7,457,733 B2 * | 11/2008 | Maille et al. | 703/2 |
| 7,688,016 B2 | 3/2010 | Aghili | |
| 2004/0193413 A1 * | 9/2004 | Wilson et al. | 704/243 |
| 2005/0001842 A1 | 1/2005 | Park et al. | |
| 2005/0043718 A1 | 2/2005 | Madhani et al. | |
| 2005/0209534 A1 | 9/2005 | Dariush | |
| 2005/0271279 A1 * | 12/2005 | Fujimura et al. | 382/203 |
| 2006/0269145 A1 | 11/2006 | Roberts | |
| 2006/0293792 A1 | 12/2006 | Hasegawa et al. | |
| 2007/0013336 A1 | 1/2007 | Nowlin et al. | |
| 2007/0140562 A1 * | 6/2007 | Linderman | 382/187 |
| 2007/0162164 A1 | 7/2007 | Dariush | |
| 2008/0019589 A1 * | 1/2008 | Yoon et al. | 382/165 |
| 2008/0181459 A1 * | 7/2008 | Martin et al. | 382/103 |
| 2008/0317331 A1 * | 12/2008 | Winn et al. | 382/154 |
| 2010/0145521 A1 | 6/2010 | Prisco et al. | |

OTHER PUBLICATIONS

PCT International Search Report and Written Opinion, PCT/US08/81171, Jan. 5, 2009, 10 pages.

PCT International Search Report and Written Opinion, PCT/US08/81201, Jan. 5, 2009, 9 pages.

* cited by examiner

REAL-TIME SELF COLLISION AND OBSTACLE AVOIDANCE

RELATED APPLICATIONS

This application claims a benefit of, and priority under 35 USC § 119(e) to, U.S. Provisional Patent Application No. 60/983,061, filed Oct. 26, 2007, the contents of which are herein incorporated by reference herein in their entirety. This application also claims a benefit of, and priority under 35 USC §119(e) to, U.S. Provisional Patent Application No. 61/088,985, filed Aug. 14, 2008.

This application is related to U.S. patent application Ser. No. 11/614,930, filed Dec. 21, 2006, titled "Reconstruction, Retargetting, Tracking, and Estimation of Motion for Articulated Systems", U.S. patent application Ser. No. 11/734,758, filed Apr. 12, 2007, titled "Control Of Robots From Human Motion Descriptors", and U.S. patent application Ser. No. 12/258,184, entitled "Real-Time Self Collision And Obstacle Avoidance Using Weighting Matrix," by Behzad Dariush, filed concurrently with this application, all of which are incorporated by reference herein in their entirety.

BACKGROUND

1. Field of Disclosure

The invention generally relates to the field of controlling motion of a system, and more specifically, to controlling motion of a system to avoid collision.

2. Description of the Related Art

Collision avoidance has been an important and widely studied problem since the inception of robotics technology. The majority of early research in this area focused on obstacle avoidance, typically for applications involving mobile robot navigation and industrial manipulation. See A. A. Maciejewski and C. A. Klein, "Obstacle avoidance for kinematically redundant manipulators in dynamically varying environments", *International Journal of Robotics Research*, 4:109-117 (1985); see also O. Khatib, "Real-Time Obstacle Avoidance for Manipulators and Mobile Robots", *The International Journal of Robotics Research* (IJRR), 5(1):90-98 (1986), both of which are incorporated by reference herein in their entirety. In these applications, the workspace was often predefined, static, or slowly varying. Moreover, application developers typically adopted the philosophy of segregating the workspace of robots and people as a safety countermeasure to avoid collisions with people. Setting large collision distance thresholds could be tolerated for many of the early mobile navigation and industrial manipulation applications. The concept of artificial potential fields proved to be an effective approach for obstacle avoidance under such circumstances.

Today, the field of robotics is moving towards development of high degree of freedom, human-like, and personal robots, which are often designed to share a common workspace and physically interact with humans. Such robots are often highly redundant which fundamentally adds new capabilities (self-motion and subtask performance capability). However, increased redundancy has also added new challenges for constraining the internal motion to avoid joint limits and self collisions. With these challenges, researchers have become increasingly aware of the need for robust collision avoidance strategies to accommodate such applications.

In particular, self collision avoidance, which was largely overlooked or not required when obstacle avoidance strategies were first developed, has recently become an important topic of research. See H. Sugiura, M. Gienger, H. Janssen, and C. Goerick, "Real-time collision avoidance with whole body motion control for humanoid robots", *IEEE Int. Conf. on Intelligent Robots and Systems (IROS 2007)*, (2007); see also O. Stasse, A. Escande, N. Mansard, S. Miossec, P. Evrard, and A. Kheddar, "Real-time (self)-collision avoidance task on a hrp-2 humanoid robot", *In Proceedings of ICRA*, pages 3200-3205, Pasadena Calif. (2008), both of which are incorporated by reference herein in their entirety. Self collision avoidance is especially challenging for humanoid robots performing humanlike tasks. The collision avoidance strategy must not only accommodate multiple colliding bodies simultaneously, but also tolerate smaller collision distances than those established for early obstacle avoidance algorithms. Furthermore, a self collision avoidance strategy should not significantly alter the reference or originally planned motion. This is particularly important in applications involving reproduction of robot motion from observed human motion, a problem often referred to as motion retargeting. See B. Dariush, M. Gienger, B. Jian, C. Goerick, and K. Fujimura, "Whole body humanoid control from human motion descriptors", Int. Conf. Robotics and Automation (ICRA), Pasadena, Calif. (2008); see also A. Nakazawa, S. Nakaoka, K. Ikeuchi, and K. Yokoi, "Imitating human dance motions through motion structure analysis", *Intl. Conference on Intelligent Robots and Systems (IROS)*, pages 2539-2544, Lausanne, Switzerland (2002), both of which are incorporated by reference herein in their entirety.

Hence, there is lacking, inter alia, a system and method for motion control of robots and other articulated rigid body systems to avoid self collisions and obstacles in real-time.

SUMMARY

Embodiments of the present invention provide a method (and corresponding system and computer program product) for avoiding collision of a body segment with unconnected structures in an articulated system. According to one aspect, a virtual surface is constructed surrounding an actual surface of the body segment. Distances between the body segment and unconnected structures are monitored. Responding to an unconnected structure penetrating the virtual surface, a redirected joint motion that prevents the unconnected structure from penetrating deeper into the virtual surface is determined. The body segment is redirected based on the redirected joint motion to avoid colliding with the unconnected structure.

According to another aspect of the present invention, a collision point on the actual surface of the body segment is determined and used to determining a redirected motion of the collision point that prevents the unconnected structure from penetrating deeper into the virtual surface. The redirect joint motion is determined based on the redirected motion of the collision point and used to avoid colliding with the unconnected structure.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

BRIEF DESCRIPTION OF DRAWINGS

The disclosed embodiments have other advantages and features which will be more readily apparent from the detailed description, the appended claims, and the accompanying drawings (figures). A brief description of the drawings is as follows:

DETAILED DESCRIPTION

The present invention provides a motion retargeting system (and corresponding method and computer program product) for real-time motion control of robots and other articulated rigid body systems while avoiding self collisions and obstacles. Collisions are avoided by constructing a virtual surface around body segments, and redirecting motion of collision points away from possible collisions when the virtual surface is penetrated.

The Figures (FIGS.) and the following description relate to embodiments of the present invention by way of illustration only. Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Motion Retargering System

Figure 1:
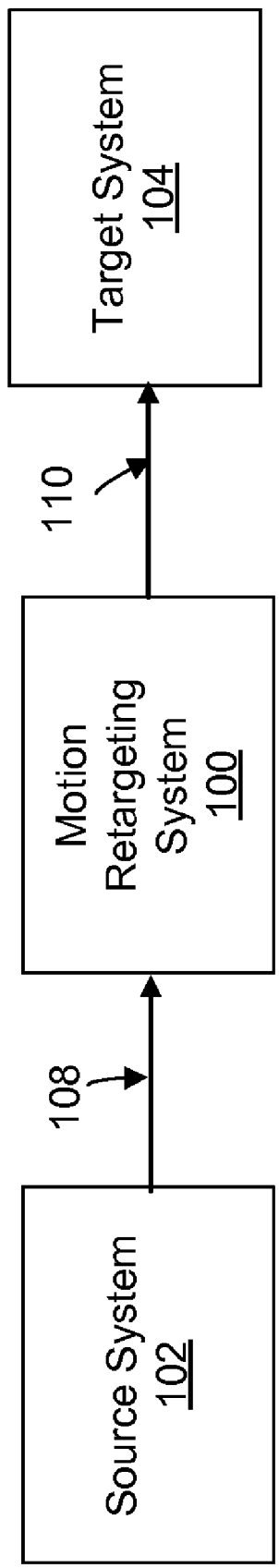
FIG. 1 is a block diagram illustrating a motion retargeting system for controlling a target system in accordance with one embodiment of the invention.

FIG. 1 is a block diagram illustrating a motion retargeting system 100 for controlling a target system 104, such as a robotic/bio-robotic system, to simulate motions tracked in a source system 102 in real time while avoiding self collisions and obstacles, according to one embodiment of the present invention. The motion retargeting system 100 (also known as motion planning system or motion filtering system) detects motion descriptors 108 of the source system 102. The source system 102 may be any motion generator, for example, a human or an animal. In response to the motion descriptors 108, the motion retargeting system 100 generates joint variables 110 for controlling the motion of the target system 104. The target system 104 may be, for example, a generic articulated system, such as a robot, an articulated mechanism (e.g., a humanoid robot), an avatar, or an exoskeleton apparatus for wearing by a human or animal.

In one embodiment, the motion retargeting system 100 captures motions generated in the source system 102 and transfers the captured motions to the target system 104, a process commonly referred to as motion retargeting. Motions in the source system 102 are tracked (e.g., by measuring marker positions, feature points) and expressed as motion descriptors 108 (also known as motion trajectories, desired task descriptors, task variables) using one or more motion primitives in Cartesian (or task) space. The motion descriptors 108 are converted to joint variables 110 (also known as joint space trajectories, joint motions, joint commands, joint motion descriptors) by the motion retargeting system 1 00. The motion retargeting system 100 uses the joint variables 1 10 to control the target system 104 to simulate the motion in the source system 102. The motion retargeting system 100 can impose constraints on motion in the target system 104 to avoid joint limits, muscular torque limits, self collisions, obstacles, and the like. For the sake of illustration, without loss of generality, the source system 102 represents a human model and the source motion represents human motion primitives which are typically observed or inferred from measurements, and the target system 104 represents a humanoid robot that is controlled to imitate the human model's motion. One of ordinary skill in the related arts would understand that the motion retargeting system 100 may be used for other purposes such as human pose estimation, tracking and estimation, and joint torque estimation in biomechanics.

Figure 2:
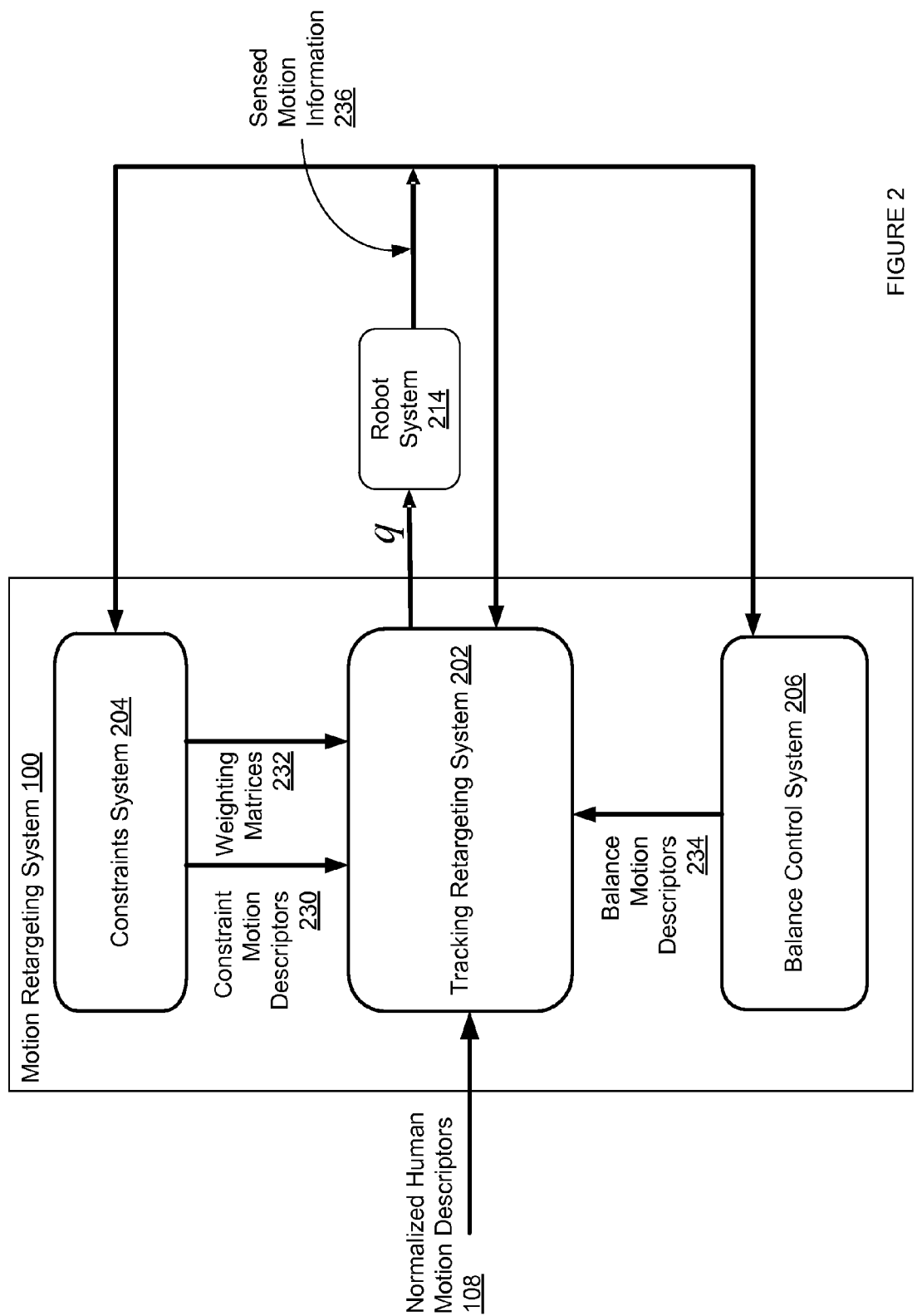
FIG. 2 is a block diagram illustrating a configuration of the motion retargeting system shown in FIG. 1 in accordance with one embodiment of the invention.

FIG. 2 is a block diagram illustrating a configuration of the motion retargeting system 100 for generating joint commands from observed motion descriptors 108 according to one embodiment. The motion retargeting system 100 generates a joint command q (the joint variables 110) for application to a robot system 214 (the target system 104) in response to the motion descriptors 108 extracted from observations of human motion in the source system 102 and sensed motion information 236 from the robot system 214. The motion retargeting system 100 comprises a tracking retargeting system 202, a constraints system 204, and a balance control system 206. The tracking retargeting system 202 generates the joint command q from the observed motion descriptors 108, constraint motion descriptors 230 and appropriate weighting matrices 232 from the constraints system 204, and balance motion descriptors 234 from the balance control system 206. The constraints system 204 generates the constraint motion descriptors 230 in response to the sensed motion information from the robot system 214. The balanced control system 206 generates the balance motion descriptors 234 in response to the sensed motion information 236 from the robot system 214. It is noted that in other embodiments the motion retargeting system 100, the tracking retargeting system 202, the constraints system 204, and/or the balance control system 206 takes the generated joint command q as input, instead of or in addition to the sensed motion information 236 from the robot system 214.

In one embodiment, the motion retargeting system 100 uses a task space control framework to generate motion for all degrees of freedom in the target system 104 (in this case, the robot system 214) from a set of desired motion descriptors 108 which are observed from measurements (e.g., at feature points), synthesized, or computed from the current configuration of the target system 104. The tracking retargeting system 202 generates motion results in a set of computed joint commands which track the desired task descriptors, e.g., minimize the Cartesian tracking error. The balance control system 206 controls the resulting motion for balance and keeps the target system 104 stable. The constraint system 204 provides commands to prevent the target system 104 from violating the physical limits, such as joint limits, velocity limits, torque limits, and also works with the tracking retargeting system 202 to ensure the target system 104 avoids obstacles, self collisions, and computational problems arising from singularities. The three systems 202, 204 and 206 may present a large number of conflicting tasks which may be resolved through a hierarchical task management strategy. Further information of resolving conflicting tasks is found in U.S. application Ser. No. 11/734,758, filed Apr. 12, 2007, titled "Control Of Robots From Human Motion Descriptors", the content of which is incorporated by reference herein in its entirety. The precision of lower-priority (or lower level of importance) factors may be sacrificed at the expense of higher priority (or higher level of importance) factors.

The motion retargeting system 100, or any of its components described below, may be configured as software (e.g., modules that comprise instructions executable by a processor), hardware (e.g., an application specific integrated circuit), or a combination thereof. The software and/or hardware may operate in a computer system that is structured to include a processor, memory, computer-readable storage medium (e.g., hard drive), network interfaces, and applicable operating system and other functional software (e.g., network drivers, communication protocols).

Trajectory Conversion Process

The tracking retargeting system 202 converts the desired trajectories (the motion descriptors 108) from Cartesian space to joint space through a trajectory conversion process. The joint (or configuration) space refers to the set of all possible configurations of the target system 104. The Cartesian (or task) space refers to the space of the source system 102.

The number of robot degrees of freedom is denoted by n. These degrees of freedom which fully characterize the joint space is described by vector $q=[q_1, \ldots, q_n]^T$. One goal for the tracking retargeting system 202 is to generate collision-free joint motion based on reference motion described in the task space. For generality, suppose the task variables operate the full six dimensional task space, three for position and three for orientation. Also, suppose the number of task variables is k. Let i (i=1 ... k) be the index of the spatial velocity vector $\dot{x}_i$ corresponding to the $i_{th}$ task descriptor. The associated Jacobian is given by $$J_i = \frac{\partial x_i}{\partial q}.$$

The mapping between the joint space velocities and the task space velocities is obtained by considering the differential kinematics relating the two spaces as follows $$\dot{x}_i = J_i(q)\dot{q}, \quad (1)$$

where $J_i$ is the Jacobian of the task. The spatial velocity vector is defined by $$\dot{x}_i = [\omega_i\ \dot{p}_i]^T, \quad (2)$$

where $\omega_i$ and $\dot{p}_i$ are vectors corresponding to the angular velocity of the task frame and the linear velocity of the task position referenced to the base frame, respectively. To augment all task variables, an augmented spatial velocity vector $\dot{x}_i$ and an augmented Jacobian matrix J are formed as follows, $$\dot{x} = [\dot{x}_1^T \ldots \dot{x}_i^T \ldots \dot{x}_k^T]^T, \quad (3)$$

$$J = [J_1^T \ldots J_i^T \ldots J_k^T]^T. \quad (4)$$

The Jacobian matrix may be decomposed to its rotational and translational components, denoted by $J_o$ and $J_p$, respectively, as follows, $$J = \begin{bmatrix} J_o \\ J_p \end{bmatrix}. \quad (5)$$

If, for example, only a position descriptor $p_i$ is observable, then the parameters in Equation 1 can be modified to $\dot{x}_i = \dot{p}_i$, and $J_i = J_{pi}$.

Closed Loop Inverse Kinematics

Closed loop inverse kinematics (CLIK) is an effective method to perform the trajectory conversion from task space to joint space. In one embodiment, the tracking retargeting system 202 utilizes a CLIK algorithm to perform the trajectory conversion. A detailed description about CLIK algorithms can be found in B. Dariush, M. Gienger, B. Jian, C. Goerick, and K. Fujimura, "Whole body humanoid control from human motion descriptors", *Int. Conf. Robotics and Automation*, (ICRA), Pasadena, Calif. (2008), the content of which is incorporated by reference herein in its entirety.

A CLIK algorithm uses a set of task descriptors as input and estimates the robot joint commands that minimize the tracking error between the reference Cartesian motion (the desired task descriptors) and predicted Cartesian motion.

In one embodiment, a control policy of the CLIK algorithm is configured to produce robot joint commands such that the Cartesian error between the predicted robot task descriptors and the reference task descriptors is minimized. The tracking performance is subject to the kinematic constraints of the robot system 214, as well as the execution of multiple and often conflicting task descriptor requirements. The formulation of such a constrained optimization is based on extensions of the CLIK formulation.

Let the velocity of the reference task descriptors in the task space be described by, $$\dot{x}_r = [\dot{x}_{r_1}^T \ldots \dot{x}_{r_i}^T \ldots \dot{x}_{r_k}^T]^T. \quad (6)$$

The joint velocities may be computed by inverting Equation 1 and adding a feedback error term to correct for numerical drift.

$$\dot{q} = J^*(\dot{x}_r + K\ e), \quad (7)$$

where $J^*$ denotes the regularized right pseudo-inverse of J weighted by a positive definite matrix $W_1$ and regularized by a positive definite damping matrix $W_2$, $$J^* = W_1^{-1} J^T (J W_1^{-1} J^T + W_2)^{-1}. \quad (8)$$

The damping matrix $W_2$ is necessary if J is ill-conditioned and is defined by $W_2 = \lambda^2 I$, where $\lambda > 0$ is a damping term, and I is an identity matrix. If $W_2 = 0$, then Equation 8 is simply the weighted right pseudo-inverse of J. Furthermore, if J is a square non-singular matrix, $W_1$ is the identity matrix, and $W_2 = 0$, the matrix $J^*$ is replaced by the standard matrix inversion $J^{-1}$.

The vector $\dot{x}_{r_i} = [\omega_{r_i}\ \dot{p}_{r_i}]^T$ corresponds to the differential kinematics of the reference motion where $\omega_{r_i}$ and $\dot{p}_{r_i}$ are the angular velocity and linear velocity of the reference task descriptors. The rate of convergence of the error for the $i_{th}$ descriptor is controlled by $K_i$, a diagonal 6×6 positive definite gain matrix. The vector e is the concatenation of the individual error terms $e_i = [e_{o_i}\ e_{p_i}]^T$, where $e_{p_i}$ and $e_{o_i}$ are the position and orientation error vectors between the reference and computed task descriptors. Further information about the tracking errors are found in Dariush, "Whole body humanoid control from human motion descriptors"; J. Y. S. Luh, M. W. Walker, and R. P. C. Paul, "Resolved-acceleration control of mechanical manipulators", *IEEE Transactions on Automatic Control*, 25:468-474 (1980); F. Chiaverini, B. Siciliano, and O. Egeland, "Review of damped least squares inverse kinematics with experiments on an industrial robot manipulator", *IEEE Trans. Control Systems Tech.*, 2(2):123-134 (1994), the contents of which are incorporated by reference herein in their entirety.

Figure 3:
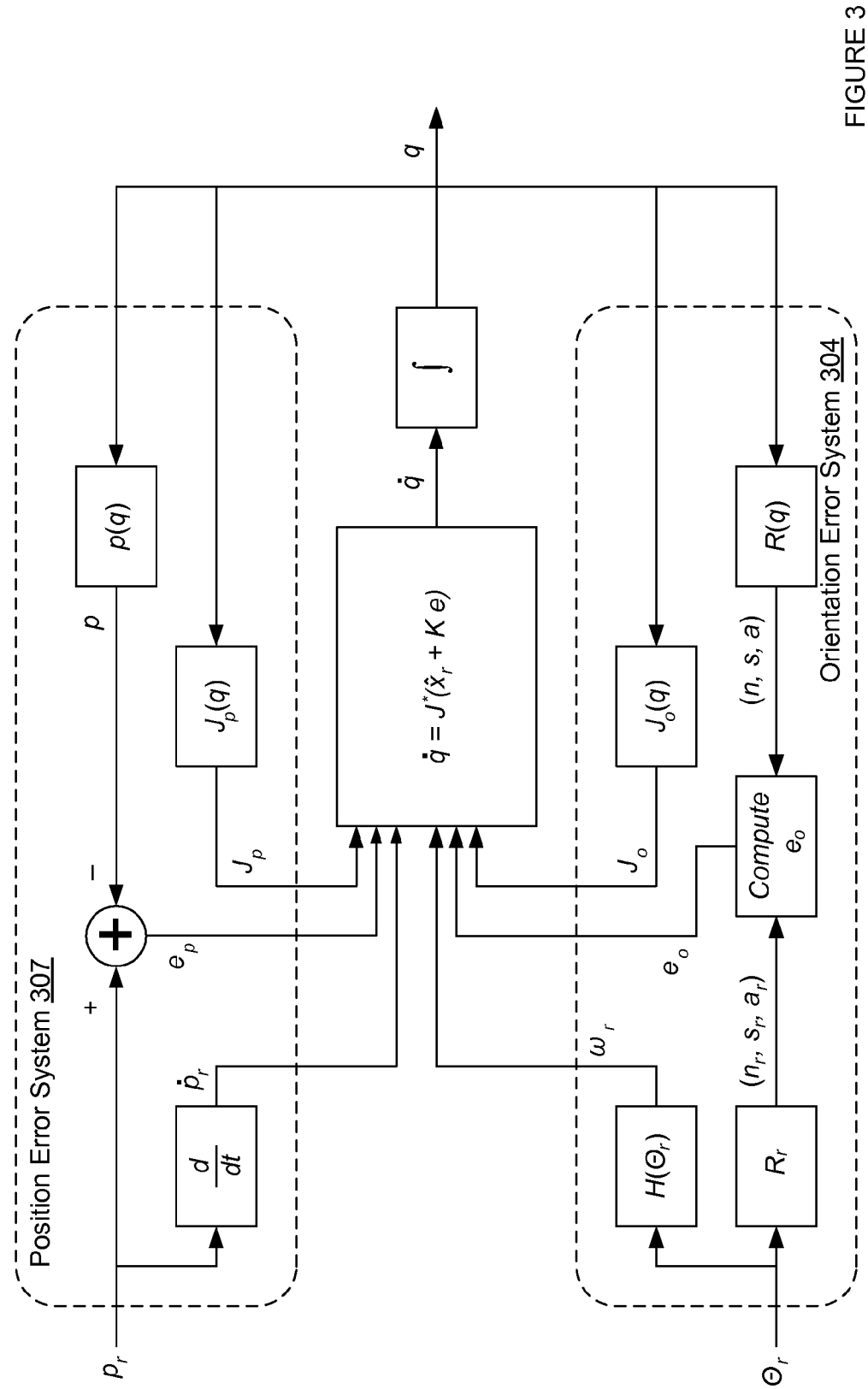
FIG. 3 is a flow diagram illustrating a tracking retargeting process in accordance with one embodiment of the invention.

FIG. 3 is a flow diagram illustrating a tracking retargeting process based on the CLIK algorithm. In one embodiment, the process is implemented in the tracking retargeting system 202, such that it can use the CLIK algorithm to track the position and orientation of the observed motion descriptors 108. As shown, the tracking retargeting system 202 generates a joint command (q) for following a time varying desired position ($p_r$) and orientation ($\Theta_r$) of the task descriptors 108 in response to position errors generated by a position error system 307 and orientation errors generated by a orientation error system 304. In one embodiment, the tracking retargeting system 202 uses Equation 7 as the control law to generate the joint command for the robot system 214.

Further information and additional embodiments of the tracking retargeting system 202 are found in B. Dariush, M. Gienger, A. Arumbakkam, Y. Zhu, K. Fujimura, and C. Goerick, "Online Transfer of Human Motion to Humanoids", *International Journal of Humanoid Robotics* (Oct. 6, 2008), and U.S. application Ser. No. 11/734,758, filed Apr. 12, 2007, titled "Control Of Robots From Human Motion Descriptors", the contents of both are incorporated by reference herein in its entirety.

Collision Avoidance

Collision avoidance of a target system 104 with itself or with other obstacles allows the target system 104 to safely execute a motion. Collision avoidance may be categorized as self-collision avoidance or obstacle avoidance. Self collision avoidance refers to a situation where two segments of the robot system 214 come into contact; whereas obstacle avoidance refers to the situation where the robot system 214 comes into contact with an object in the environment. Self collision avoidance may be further categorized as avoidance of self collision between connected body segment pairs and avoidance of self collision between unconnected body segment pairs. By connected segment pairs, it is implied that the two segments are connected at a common joint and assumed that the joint is rotational. In the case of obstacle avoidance, the two colliding bodies are always unconnected.

An approach to avoid self collisions and obstacles is described in detail below. The approach can be implemented in the CLIK formulation of the tracking retargeting system 202. Avoidance of self collision between connected body segment pairs are described first, followed by avoidance of collision between unconnected bodies. It is noted that the approach for avoidance of collision between unconnected bodies can be used to avoid both self collision between unconnected body segment pairs and collision with obstacle since both involves a segment of the robot system 214 comes into contact with an unconnected body.

Avoidance of Self Collision Between Two Connected Bodies

If two segment pairs are connected at a common rotational joint, i.e. connected segment pairs, self collision avoidance between the segment pairs may be handled by limiting the joint range. Joint limits for self collision avoidance need not correspond to the physical joint limits; rather, they may be more conservative virtual joint limits whose values are obtained by manually verifying the bounds at which collision does not occur. Therefore, collision avoidance between segment pairs can be achieved by limiting the joint range.

In one embodiment, avoidance of self collision between connected body segments and joint limit avoidance are achieved by the proper selection of the weighting matrix $W_1$ in Equation 8. One example weighting matrix is defined by the Weighted Least-Norm (WLN) solution. The WLN solution was originally proposed by T. F. Chan and R. V. Dubey, "A weighted least-norm solution based scheme for avoiding joint limits for redundant joint manipulators", IEEE Transactions on Robotics and Automation, 11(2), (1995), the content of which is incorporated by reference herein in its entirety. A WLN solution is formulated in the context of Damped Least Squares Jacobian inverse. The WLN solution is utilized to generate an appropriate weighting matrix based on the gradient of a joint limit function to dampen joints nearing their limits. This solution is described below.

A candidate joint limit function that has higher values when the joints near their limits and tends to infinity at the joint limits is denoted by H(q). One such candidate function proposed by Zghal et al. is given by $$H(q) = \frac{1}{4} \sum_{i=1}^{n} \frac{(q_{i,\max} - q_{i,\min})^2}{(q_{i,\max} - q_i)(q_i - q_{i,\min})}, \quad (9)$$

where $q_i$ represents the generalized coordinates of the $i_{th}$ degree of freedom, and $q_{i,min}$ and $q_{i,max}$ are the lower and upper joint limits, respectively. See H. Zghal and R. V. Dubey, "Efficient gradient projection optimization for manipulators with multiple degrees of redundancy", *Int. Conf. Robotics and Automation*, volume 2, pages 1006-1011 (1990), the content of which is incorporated by reference herein in its entirety. The upper and lower joint limits represent the more conservative limits between the physical joint limits and the virtual joint limits used for collision avoidance. Note that H(q) is normalized to account for the variations in the range of motion. The gradient of H. denoted as ▢H, represents the joint limit gradient function, an n×1 vector whose entries point in the direction of the fastest rate of increase of H.

$$\nabla H = \frac{\partial H}{\partial q} = \left[ \frac{\partial H}{\partial q_1}, \ldots, \frac{\partial H}{\partial q_n} \right]. \quad (10)$$

The element associated with joint i is given by, $$\frac{\partial H(q)}{\partial q_i} = \frac{(q_{i,\max} - q_{i,\min})^2 (2q_i - q_{i,\max} - q_{i,\min})}{4(q_{i,\max} - q_i)^2 (q_i - q_{i,\min})^2}. \quad (11)$$

The gradient $$\frac{\partial H(q)}{\partial q_i}$$

is equal to zero if the joint is at the middle of its range and goes to infinity at either limit. The joint limit gradient weighting matrix, denoted by $W_{JL}$, is defined by the following n×n diagonal matrix with diagonal elements $w_{JLi}$ (i=1 ... n):

$$W_{JL} = \begin{bmatrix} w_{JL1} & 0 & 0 & 0 \\ 0 & w_{JL2} & 0 & 0 \\ 0 & 0 & \ddots & 0 \\ 0 & 0 & 0 & w_{JLn} \end{bmatrix}. \quad (12)$$

The weighting matrix $W_1$ in Equation 8 is constructed by $W_{JL}$ (e.g., $W_1 = W_{JL}$). The diagonal elements $w_{JLi}$ are defined by:

$$w_{JLi} = \begin{cases} 1 + \left|\frac{\partial H}{\partial q_i}\right| & \text{if } \Delta|\partial H/\partial q_i| \geq 0 \\ 1 & \text{if } \Delta|\partial H/\partial q_i| < 0 \end{cases}. \quad (13)$$

The term $\Delta|\partial H/\partial q_i|$ represents the change in the magnitude of the joint limit gradient function. A positive value indicates the joint is moving toward its limit while a negative value indicates the joint is moving away from its limit. When a joint moves toward its limit, the associated weighting factor described by the first condition in Equation 13, becomes very large causing the motion to slow down. When the joint nearly reaches its limit, the weighting factor is near infinity and the corresponding joint virtually stops. If the joint is moving away from the limit, there is no need to restrict or penalize the motions. In this scenario, the second condition in Equation 13 allows the joint to move freely. Therefore, $W_{JL}$ can be used for joint limit avoidance.

Avoidance of Collision Between Unconnected Bodies

As noted above, the approach for avoidance of collision between unconnected bodies described below can be used to avoid both self collision between unconnected body segment pairs and collision with obstacle since both involves a body segment of the robot comes into contact with an unconnected structure.

Figure 4:
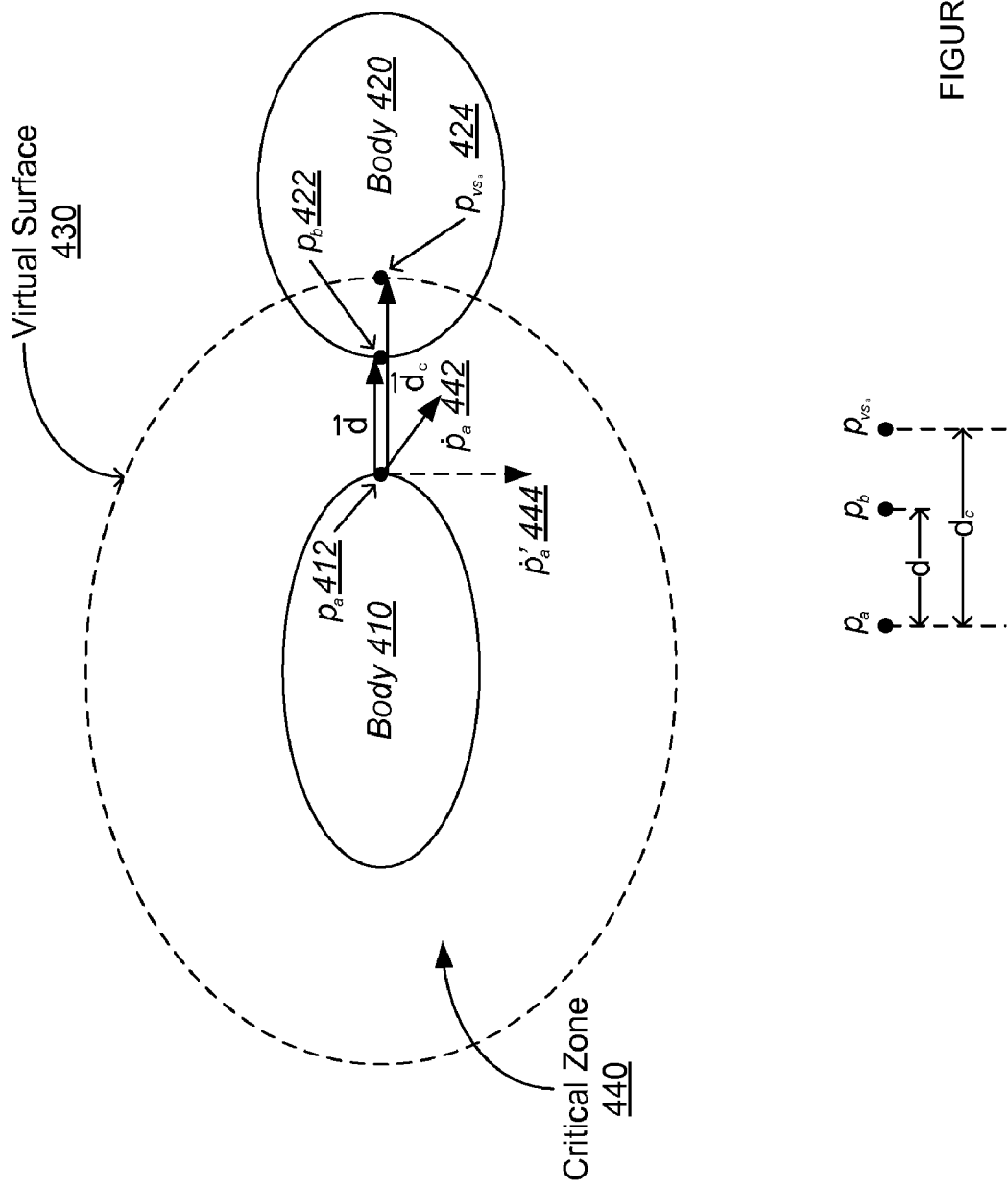
FIG. 4 is a diagram illustrating two unconnected rigid bodies redirected to avoid colliding into each other in accordance with one embodiment of the invention.

FIG. 4 is a diagram illustrating two unconnected rigid bodies 410, 420 (i.e., bodies which do not share a joint) redirected to avoid colliding into each other according to one embodiment. In general, body 410 (also referred to as body A) and body 420 (also referred to as body B) may both be in motion. However, for simplicity and without losing generality, suppose body A is moving toward a stationary body B, as indicated by linear velocity $\dot{p}_a$ 442. The coordinates of the shortest distance d ($d \geq 0$) between the two bodies are denoted by $p_a$ 412 and $p_b$ 422, referring to the base frame of the joint space. The two points, $p_a$ and $p_b$, are also referred to as collision points.

The unit normal vector between the collision points is denoted by $$\hat{n}_a = \frac{p_b - p_a}{|p_b - p_a|},$$

and the vector pointing from $p_a$ to $p_b$ is denoted by $\vec{d} = d\,\hat{n}_a$. A 3-dimentional virtual surface 430 is constructed to surround body A, shown by a dashed line in FIG. 4. For every point on body A, its associated virtual surface point is located by a vector $\vec{d}_c = d_c\,\hat{n}$, where $d_c$ is a critical distance, and $\hat{n}$ is the unit normal vector at the surface point. The coordinates of the point on the virtual surface corresponding to $p_a$, denoted by $p_{vs_a}$ 424, is defined by $$p_{vs_a} = p_a + d_c\,\hat{n}_a. \quad (14)$$

The region between the actual surface of body A and its virtual surface 430 is referred to as the critical zone 440. If body B is stationary, the motion at $p_a$ can be redirected to prevent penetration in the critical zone 440. This redirection is invoked when $d < d_c$.

In one embodiment, the tracking retargeting system 202 controls (or redirects) the motion of $p_a$ by modifying the trajectory of the desired task descriptor $p_r$ for body A in the task space. The redirected motion of $p_a$ is denoted by $p'_a$ and its associated linear velocity by $\dot{p}'_a$ 444.

The tracking retargeting system 202 can redirect the collision point to prevent the two bodies from penetrating deeper into the critical zone 440 using different magnitude and direction of $\dot{p}'_a$ 444. In one embodiment, the tracking retargeting system 202 redirects the collision point Pa in a direction opposite to the unit normal vector $\hat{n}_a$. In another embodiment, the tracking retargeting system 202 redirects the collision point $p_a$ so that it slides along a direction which is tangent to the surface of body A at the collision point $p_a$, as shown in FIG. 4.

$$\dot{p}'_a = \dot{p}_a - (\dot{p}_a \cdot \hat{n}_a)\hat{n}_a. \quad (15)$$

Utilizing the above redirection vector, the tracking retargeting system 202 guides the collision point motion of $p_a$ along the virtual surface boundary, producing a more natural motion toward its target.

To find the mapping between $\dot{p}'_a$ and $\dot{p}_r$, a consider first the equivalent redirected joint velocity vector $\dot{q}'$, given by $$\dot{q}' = J^*_a \dot{p}'_a + SJ^*_a(\dot{p}_r + Ke), \quad (16)$$

where $J_a = \partial p_a/\partial q$ is the Jacobian at the collision point $p_a$ and $J^*_a$ is its weighted Damped Least Squares inverse. The matrix $S = \mathrm{diag}(s_1 \ldots s_n)$ is a diagonal selection matrix where $s_i = 1$ when the $i_{th}$ column of $J_a$ has all zero entries and $s_i = 0$ elsewhere. The term $J^*_a(\dot{p}_r + Ke)$ is the joint velocity solution obtained from Equation 7.

The physical interpretation of Equation 16 is as follows. The first term determines the joint velocities needed to redirect the collision point velocities along $\dot{p}'_a$. Any zero column of $J_a$ (all zero entries) implies that the associated degree of freedom does not contribute to the motion of the collision point $p_a$. The second term in Equation 16 is the orthogonal complement of the first term which computes the entries for those joint velocities which do not affect the motion of the collision point $p_a$.

Based on the collision free joint velocity commands computed from Equation 16, a redesigned position task descriptor trajectory may be computed as follows $$\dot{p}'_r = J\dot{q}'. \quad (17)$$

The closed loop inverse kinematics equation with the modified parameters is given by $$\dot{q} = J^*_p(\dot{p}'_d + K'e'), \quad (18)$$

where $e' = p'_r - p'$ and $K'$ is an adaptively changing diagonal feedback gain matrix whose values decrease as the distance d decreases. Note that $p'_r$ at the current time t may be computed by a first order numerical integration, $$p'_r(t) = p'_r(t - dt) + \dot{p}'_r(t - dt)dt. \quad (19)$$

Figure 5:
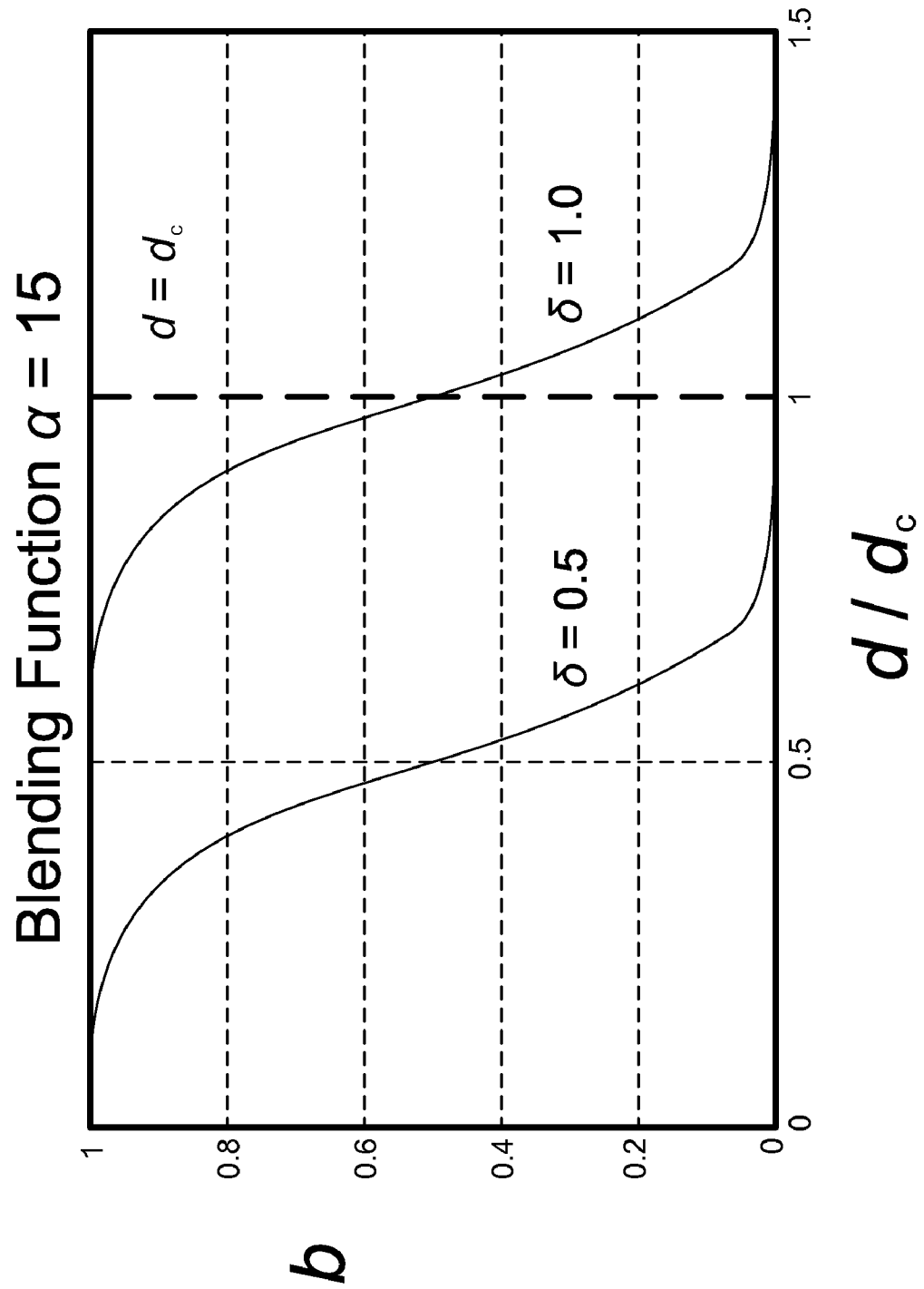
FIG. 5 is a diagram illustrating the plot of an example blending function used to avoid collision in accordance with one embodiment of the invention.

The instantaneous redirection $\dot{p}_a \to \dot{p}'_a$, as described above, produces a discontinuous first derivative of $p_a$ at the boundary $d = d_c$. The discontinuity of $\dot{p}_a$ results in a discontinuity of $\dot{p}'_r$, as given by the solution in Equation 17. To preserve first order continuity, the tracking retargeting system 202 may blend the solutions of $\dot{p}'_r$ before and after redirection occurs. A blended solution to Equation 17 is given by $$p'_r = (1-b)p'_r + b J \dot{q}', \qquad (20)$$

where b is a suitable blending function such as the following Sigmoidal function $$b(d) = \frac{e^{-\alpha(d/d_c - \delta)}}{1 + e^{-\alpha(d/d_c - \delta)}}, \qquad (21)$$

where α and δ are scalar parameters used to modulate the blending rate and shift of the blending function, respectively. FIG. 5 is a diagram illustrating the plot of the blending function in relation to the ratio $d/d_c$ for a=15. The blending function is plotted for δ=0.5 and δ=1.0. The parameter δ may be used to shift the distance d where blending is initiated and terminated. In the case δ=0.5, when d>$d_c$ the function b(d)≈0. implies that the second term in Equation 20 is effectively zero so that there is no redirection of the original task descriptor velocity (i.e., $\dot{p}'_r = \dot{p}_r$). At the other extreme, when d=0. the function b(d)'1, implies that the first term in Equation 20 is zero and the reference trajectory is altered in order to redirect the collision points along the tangent surface. To be more conservative, the tracking retargeting system 202 may be configured to set δ=1.0 in the blending function. Under this configuration, blending initiates even before the collision points reach their critical distance $d_c$.

The case where body A is stationary and body B is in motion is the dual of the problem considered above. When both body A and body B are in motion, the tracking retargeting system 202 can specify the redirection vectors at the critical points $p_a$ and $p_b$ and use augmentation to control both critical points. The augmented velocity vector and Jacobian at the critical points are described by, $$\dot{p}_{ab} = [\dot{p}'_a \dot{p}'_b]^T, \qquad (22)$$

$$J_{ab} = [J_a J_b]^T. \qquad (23)$$

The redirected joint velocities can be solve following the same procedure as in Equation 16, $$\dot{q}' = J^*_{ab} \dot{p}'_{ab} + SJ^*_{ab}(\dot{p}_r + Ke). \qquad (24)$$

The redirected task descriptors and the inverse kinematics solution follows the same procedure as previously described when only the motion of body A is considered.

Figure 6:
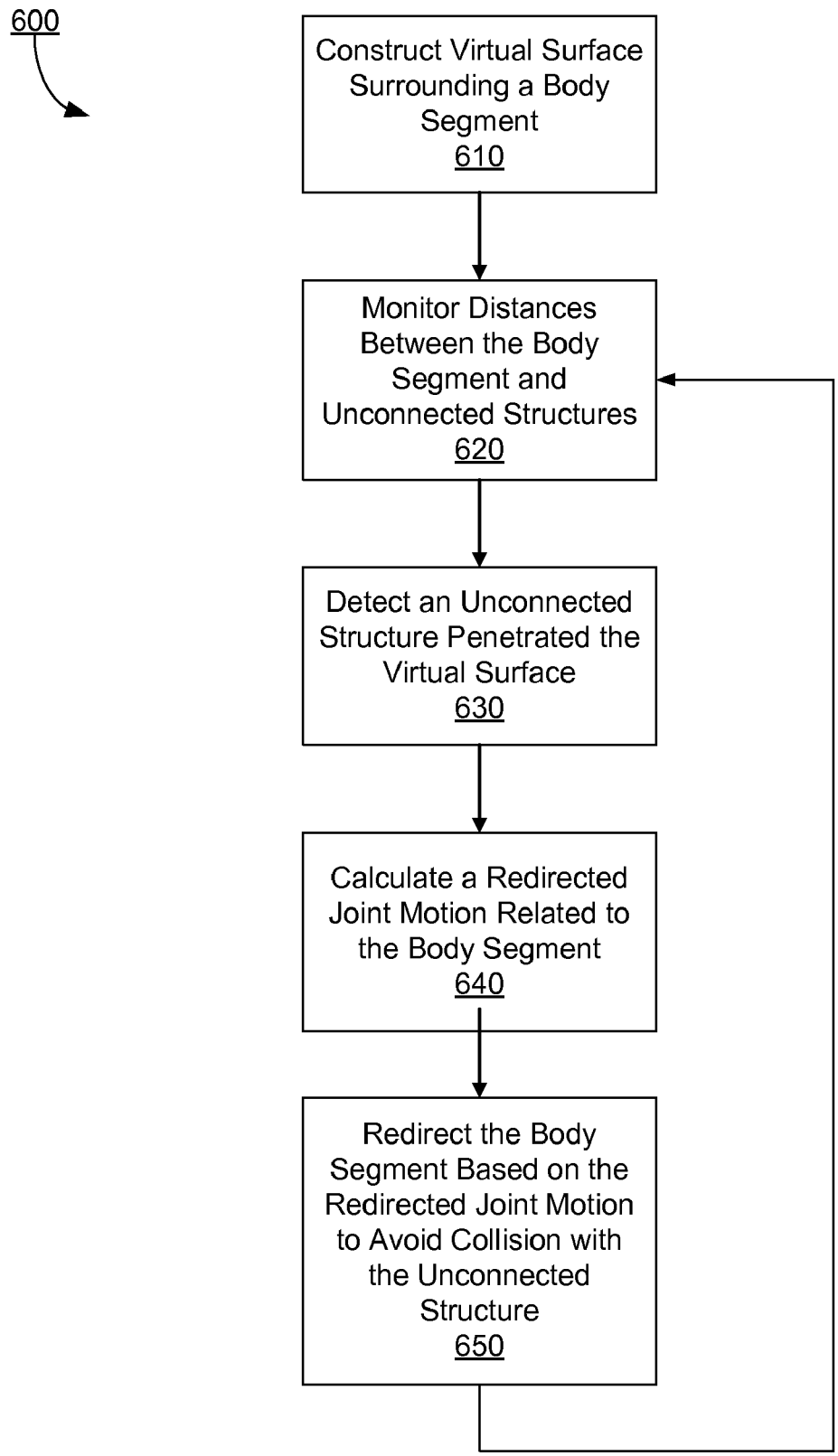
FIG. 6 is a flowchart illustrating an example process for preventing collisions between unconnected bodies in accordance with one embodiment of the invention.

FIG. 6 is a flowchart illustrating an example process 600 for preventing collisions between unconnected bodies utilizing the above algorithm according to on embodiment of the present invention. The process 600 can be executed or otherwise performed by, for example, the tracking retargeting system 202 illustrated in FIG. 2. The process 600 focuses on collision prevention between one moving body segment of a robot system 214 and a static unconnected structure. One of ordinary skill in the related arts would understand that the process 600 can be applied to some or all body segments of the robot system 214, and/or to collision prevention between two moving bodies.

One or more portions of the process 600 may be implemented in embodiments of hardware and/or software or combinations thereof. For example, the process 600 may be embodied through instructions for performing the actions described herein and such instrumentations can be stored within a tangible computer readable medium (e.g., flash memory, hard drive), and are executable by a computer processor. Furthermore, one of ordinary skill in the related arts would understand that other embodiments can perform the steps of the process 600 in different order. Moreover, other embodiments can include different and/or additional steps than the ones described here. The tracking retargeting system 202 can perform multiple instances of the steps of the process 600 concurrently and/or in parallel.

The tracking retargeting system 202 controls motion of the robot system 214 based on motion descriptors received from a source system 102. The tracking retargeting system 202 constructs 610 a virtual surface surrounding a body segment of the robot system 214. The distance between the virtual surface and the actual surface of the body segment is determined by a critical distance. The tracking retargeting system 202 monitors 620 distances between the body segment and unconnected structures such as indirectly connected or unconnected body segments and obstacles in the environment. In one embodiment, the tracking retargeting system 202 maintains a distance table listing the distances between the body segment and all unconnected structures that may potentially collide with the body segment, measures their distances through sensors in real time, and updates the distance table accordingly.

The tracking retargeting system 202 detects 630 that an unconnected structure has penetrated the virtual surface based on the monitored distances. If the distance between the body segment and the unconnected structure passes (or reaches) the critical distance $d_c$, the tracking retargeting system 202 determines that the unconnected structure has penetrated the virtual surface and thus poses a threat to collide with the body segment. It is noted that in alternate embodiments the tracking retargeting system 202 determines the collision threat when the two unconnected bodies approaches the critical distance $d_c$.

The tracking retargeting system 202 calculates (or determines) 640 a redirected joint motion that affects the motion of the body segment. In one embodiment, the tracking retargeting system 202 identifies a collision point on the actual surface of the body segment, and calculates (or computes, determines) a redirected motion of the collision point that prevents the unconnected structure from penetrating deeper into the virtual surface (e.g. using Equation 15). The tracking retargeting system 202 calculates a redirected joint motion that causes the redirected motion at the collision point (e.g., using Equation 16). The tracking retargeting system 202 calculates a redesigned task descriptor of a feature point (e.g., using Equation 17) based on the redirected joint velocity, and calculates 640 a redirected joint motion based on the redirected task descriptor (e.g., using Equation 18).

The tracking retargeting system 202 redirects 650 the body segment based on the redirected joint motion to avoid collision with the unconnected structure. Thereafter, the tracking retargeting system 202 continues monitoring 620 the redirected body segment to prevent future collisions with unconnected structures.

Alternate Embodiments

The above embodiments describe a motion retargeting system for real-time motion control of robot systems to avoid self collisions and obstacles in motion retargeting. One skilled in the art would understand that the motion retargeting system can be used to control other articulated rigid body systems, either in real environment or virtual environment (e.g., human figure animation), and for purpose other than motion retargeting (e.g., robotic motion generation and control, human pose estimation, tracking and estimation, and joint torque estimation in biomechanics).

Some portions of above description describe the embodiments in terms of algorithmic processes or operations, for example, the processes and operations as described with FIG.

6. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for real-time motion control of robots and other articulated rigid body systems to avoid self collisions and obstacles. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A method for avoiding collision of a body segment in an articulated system, the method comprising:
   controlling motion of a body segment towards a target based on a generated joint motion;
   constructing a virtual surface surrounding an actual surface of the body segment, the virtual surface comprising a plurality of virtual surface points each located at least a nonzero distance away from a corresponding surface point on an actual surface of the body segment in a direction of a unit normal vector from the surface point;
   monitoring a distance between the actual surface and an unconnected structure;
   detecting that the unconnected structure penetrates the virtual surface;
   determining a collision point on the actual surface of the body segment;
   determining a redirected joint motion of the collision point that prevents the unconnected structure from penetrating deeper into the virtual surface; and
   redirecting the body segment toward the target based on the redirected joint motion without colliding with the unconnected structure.

2. The method of claim 1, wherein the virtual surface is a 3-dimentional virtual surface.

3. The method of claim 1, wherein determining the redirected joint motion further comprises:
   determining a redirected motion of the collision point that prevents the unconnected structure from penetrating deeper into the virtual surface; and
   determining the redirected joint motion of the collision point based on the redirected motion of the collision point.

4. The method of claim 3, wherein the redirected motion of the collision point is in a direction tangent to the actual surface at the collision point.

5. The method of claim 3, wherein the redirected motion of the collision point is in a direction away from the unconnected structure.

6. The method of claim 1, further comprising:
   receiving a motion descriptor of a feature point; and
   generating the generated joint motion based on the motion descriptor.

7. The method of claim 6, wherein the motion descriptor describes a human motion, the articulated system comprises a humanoid robot, and the joint motion controls the humanoid robot to simulate the human motion.

8. The method of claim 6, wherein determining the redirected joint motion comprises:
   determining a second redirected joint motion that directs the body segment towards the target while preventing the unconnected structure from penetrating deeper into the virtual surface;
   determining a redesigned motion descriptor of the feature point based on the second redirected joint motion; and
   determining the redirected joint motion based on the redesigned motion descriptor.

9. The method of claim 1, wherein determining the redirected joint motion comprises determining the redirected joint motion using a blending function to preserve a motion continuity of the body segment during the redirection.

10. The method of claim 9, wherein the blending function is a Sigmoidal function.

11. The method of claim 1, wherein the redirected joint motion is determined using a closed loop inverse kinematics (CLIK) algorithm.

12. The method of claim 1, wherein the unconnected structure comprises a second body segment in the articulated system, and wherein the method further comprises:
   determining a second redirected joint motion for the second body segment that prevents the second body segment from colliding with the body segment; and
   redirecting the second body segment based on the second redirected joint motion to avoid colliding with the body segment.

13. A computer program product for avoiding collision of a body segment in an articulated system, the computer program product comprising a non-transitory computer-readable storage medium containing executable computer program code for performing a method comprising:
   controlling motion of a body segment towards a target based on a generated joint motion;
   constructing a virtual surface surrounding an actual surface of the body segment, the virtual surface comprising a plurality of virtual surface points each located at least a nonzero distance away from a corresponding surface point on an actual surface of the body segment in a direction of a unit normal vector from the surface point;
   monitoring a distance between the actual surface and an unconnected structure;
   detecting that the unconnected structure penetrates the virtual surface;
   determining a collision point on the actual surface of the body segment;
   determining a redirected joint motion of the collision point that prevents the unconnected structure from penetrating deeper into the virtual surface; and
   redirecting the body segment toward the target based on the redirected joint motion without colliding with the unconnected structure.

14. The computer program product of claim 13, wherein the virtual surface is a 3-dimentional virtual surface.

15. The computer program product of claim 13, wherein the method further comprises:
   determining a redirected motion of the collision point that prevents the unconnected structure from penetrating deeper into the virtual surface; and
   determining the redirected joint motion of the collision point based on the redirected motion of the collision point.

16. The computer program product of claim 15, wherein the redirected motion of the collision point is in a direction tangent to the actual surface at the collision point.

17. The computer program product of claim 15, wherein the redirected motion of the collision point is in a direction away from the unconnected structure.

18. The computer program product of claim 13, wherein the method further comprises:
   receiving a motion descriptor of a feature point; and
   generating the generated joint motion based on the motion descriptor.

19. The computer program product of claim 18, wherein the motion descriptor describes a human motion, the articulated system comprises a humanoid robot, and the joint motion controls the humanoid robot to simulate the human motion.

20. The computer program product of claim 18, wherein determining the redirected joint motion comprises:
   determining a second redirected joint motion that directs the body segment towards the target while preventing the unconnected structure from penetrating deeper into the virtual surface;
   determining a redesigned motion descriptor of the feature point based on the second redirected joint motion; and
   determining the redirected joint motion based on the redesigned motion descriptor.

21. The computer program product of claim 13, wherein determining the redirected joint motion comprises determining the redirected joint motion using a blending function to preserve a motion continuity of the body segment during the redirection.

22. The computer program product of claim 21, wherein the blending function is a Sigmoidal function.

23. The computer program product of claim 13, wherein the redirected joint motion is determined using a closed loop inverse kinematics (CLIK) algorithm.

24. The computer program product of claim 13, wherein the unconnected structure comprises a second body segment in the articulated system, and wherein the method further comprises:
   determining a second redirected joint motion for the second body segment that prevents the second body segment from colliding with the body segment; and
   redirecting the second body segment based on the second redirected joint motion to avoid colliding with the body segment.

25. A system for avoiding collision of a body segment in an articulated system, the system comprising:
   a computer processor for executing executable computer program code;
   a computer-readable storage medium containing the executable computer program code for performing a method comprising:
      controlling motion of a body segment towards a target based on a generated joint motion;
      constructing a virtual surface surrounding an actual surface of the body segment, the virtual surface comprising a plurality of virtual surface points each located at least a nonzero distance away from a corresponding surface point on an actual surface of the body segment in a direction of a unit normal vector from the surface point;
      monitoring a distance between the actual surface and an unconnected structure;
      detecting that the unconnected structure penetrates the virtual surface;
      determining a collision point on the actual surface of the body segment;
      determining a redirected joint motion of the collision point that prevents the unconnected structure from penetrating deeper into the virtual surface; and
      redirecting the body segment toward the target based on the redirected joint motion without colliding with the unconnected structure.

26. The system of claim 25, wherein the virtual surface is a 3-dimentional virtual surface.

27. The system of claim 25, wherein the method further comprises:
   determining a redirected motion of the collision point that prevents the unconnected structure from penetrating deeper into the virtual surface; and
   determining the redirected joint motion of the collision point based on the redirected motion of the collision point.

28. The system of claim 27, wherein the redirected motion of the collision point is in a direction tangent to the actual surface at the collision point.

29. The system of claim 27, wherein the redirected motion of the collision point is in a direction away from the unconnected structure.

30. The system of claim 25, wherein the method further comprises:
   receiving a motion descriptor of a feature point; and
   generating the generated joint motion based on the motion descriptor.

31. The system of claim 30, wherein the motion descriptor describes a human motion, the articulated system comprises a humanoid robot, and the joint motion controls the humanoid robot to simulate the human motion.

32. The system of claim 30, wherein determining the redirected joint motion comprises:
   determining a second redirected joint motion that directs the body segment towards the target while preventing the unconnected structure from penetrating deeper into the virtual surface;
   determining a redesigned motion descriptor of the feature point based on the second redirected joint motion; and
   determining the redirected joint motion based on the redesigned motion descriptor.

33. The system of claim 25, wherein determining the redirected joint motion comprises determining the redirected joint motion using a blending function to preserve a motion continuity of the body segment during the redirection.

34. The system of claim 33, wherein the blending function is a Sigmoidal function.

35. The system of claim 25, wherein the redirected joint motion is determined using a closed loop inverse kinematics (CLIK) algorithm.

36. The system of claim 25, wherein the unconnected structure comprises a second body segment in the articulated system, and wherein the method further comprises:
   determining a second redirected joint motion for the second body segment that prevents the second body segment from colliding with the body segment; and
   redirecting the second body segment based on the second redirected joint motion to avoid colliding with the body segment.

* * * * *